United States Patent
Pöchmüller

(10) Patent No.: US 6,304,499 B1
(45) Date of Patent: Oct. 16, 2001

(54) INTEGRATED DYNAMIC SEMICONDUCTOR MEMORY HAVING REDUNDANT UNITS OF MEMORY CELLS, AND A METHOD OF SELF-REPAIR

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/677,357

(22) Filed: Oct. 2, 2000

(30) Foreign Application Priority Data

Sep. 30, 1999 (DE) .............................. 199 47 041

(51) Int. Cl.⁷ .................................. G11C 29/00
(52) U.S. Cl. .......................... 365/200; 365/201
(58) Field of Search .................. 365/201, 200, 365/225.7, 185.09

(56) References Cited

U.S. PATENT DOCUMENTS

| | | | | |
|---|---|---|---|---|
| 5,923,600 | * | 7/1999 | Momohara | 365/201 |
| 6,011,734 | * | 1/2000 | Pappert | 365/200 |
| 6,144,592 | * | 11/2000 | Kanda | 365/200 |

FOREIGN PATENT DOCUMENTS 198 19 254 A1  9/1999 (DE).

* cited by examiner

*Primary Examiner*—Tan T. Nguyen
(74) *Attorney, Agent, or Firm*—Herbert L. Lerner; Laurence A. Greenberg; Werner H. Stemer

(57) ABSTRACT

The integrated dynamic semiconductor memory has memory cells which are combined to form individually addressable normal units and redundant units. The redundant units are used to replace faulty normal units. The address of a normal unit to be replaced is in each case stored in memory units. A self-test unit carries out a functional test of the memory cells with a defined memory-retention time for the memory cell contents, and an analysis as to which of the normal units are to be replaced by which of the redundant units. The memory units are programmed in accordance with the analysis result, and the memory-retention time is increased following the programming. The functional test, the analysis and the programming are repeated until all the memory units have been programmed. This makes it possible to achieve a high quality semiconductor memory in terms of its memory-retention time for the memory cell contents, with a comparatively low test and repair effort.

10 Claims, 2 Drawing Sheets

INTEGRATED DYNAMIC SEMICONDUCTOR MEMORY HAVING REDUNDANT UNITS OF MEMORY CELLS, AND A METHOD OF SELF-REPAIR

BACKGROUND OF THE INVENTION

FIELD OF THE INVENTION

The invention lies in the semiconductor technology field. More specifically, the present invention relates to an integrated semiconductor memory having redundant units of memory cells for replacing normal units of memory cells, and to a method for self-repair of the semiconductor memory.

Integrated semiconductor memories, such as those described in German published patent application DE 198 19 254, generally have redundant word lines or redundant bit lines for repairing faulty memory cells. Those word lines or bit lines can replace the addresses of regular lines with defective memory cells. In that case, the integrated memory is tested, for example, using an external test facility or a self-test device, and the redundant elements are then programmed. A redundant circuit then has programmable elements, for example in the form of laser fuses or electrically programmable fuses, which are used to store the address of a line to be replaced. These are programmed, for example, in the course of the production process of the memory by means of a laser beam or a so-called burning or fusing voltage.

A functional test of a semiconductor memory with subsequent repair is normally carried out in a number of steps: in a first test configuration, functional tests are carried out on a semiconductor module which has been removed from its casing (wafer level test), and any defects found are repaired by programming the laser fuses. These tests are normally carried out in complex test systems with a high degree of parallelity for a number of semiconductor modules, in order to keep the test time and test expenses low. In a further test configuration, functional tests are carried out on the semiconductor module in its casing (module test). In contrast to defects which are found in a wafer level test, defects identified there are not repaired by means of laser fuses. The semiconductor module in its housing can be repaired in the appropriate test arrangement by programming electrical fuses, since these can also be programmed after the semiconductor module has been fitted into a casing, via electrical contacts.

One of the tests which until now have been carried out at wafer level is a so-called retention test. There, memory cells in a semiconductor memory are tested for the memory-retention time of the memory cell contents. Particularly in the case of dynamic semiconductor memories and in operating periods during which no access is being made to the memory cells, a so-called self-refresh mode is required in order to refresh the memory cell contents, which may be volatile (for example due to leakage currents), and thus to maintain them in the long term. The maximum achievable memory-retention time for the memory cell contents of a memory cell is the governing factor when determining the time period which is required between two self-refresh cycles. In the interest of a current drawer which is as low as possible, one aim is in this case to keep the time period between two self-refresh cycles as long as possible.

When carrying out a retention test, the memory-retention time is normally increased in discrete steps, for example from 256 ms to 384 ms and 512 ms. Depending on the test result, the tested semiconductor memories are sorted into different quality groups. The number of memory cells to be replaced is in practice highly dependent on the tested memory-retention time, with the number of faulty memory cells normally rising exponentially with the memory-retention time. The aim of a semiconductor memory module having a memory-retention time which is as long as possible contrasts with having a limited number of redundant units of memory cells. This means that the number of faulty memory modules rises if the required memory-retention time is long.

Since a large number of memory modules are tested in parallel, the testing time is relatively long in comparison with the number of fault-free memory modules. Thus, for example as a test phase progresses, a retention test with an increased memory-retention time is carried out for all the memory modules to be tested in parallel although, even at this stage, some of the memory modules do not satisfy the requirements of a previous retention test. The tests are normally carried out up to a defined memory-retention time, in order to prevent the test time from becoming excessively long. This leads to the outcome that certain memory modules, whose quality with regard to the memory-retention time is potentially higher, are not identified.

In the above-mentioned German document DE 198 19 254 A1, it is proposed that a faulty chip identification circuit unit be provided in order to reduce the overall testing time of a chip having a DRAM unit and a logic unit, by means of which faulty chip identification circuit unit a tester of the logic unit can identify, in particular, whether the DRAM unit is faulty, so that it is possible to save a complex and useless investigation of the logic units of chips with faulty DRAM units. To this end, at the time when the DRAM unit is tested, which takes place before the logic unit is tested, when the decision is made that the DRAM unit cannot be made to conform even by using a redundant circuit, the fault data are written to the faulty chip identification circuit unit. These data are then identified by the tester of the logic unit.

SUMMARY OF THE INVENTION

The object of the invention is to provide a circuit configuration for an integrated dynamic semiconductor memory having redundant memory cell units for replacement of normal memory cell units, which overcomes the above-noted deficiencies and disadvantages of the prior art devices and methods of this kind, and which allows the semiconductor memory to achieve as high a quality as possible with regard to the memory-retention time of its memory cell contents, with a comparatively low test and repair effort. A further object is to specify a method for self-repair of such a semiconductor memory which allows the memory cell contents of the semiconductor memory to have as long a memory-retention time as possible yet the test and repair time is kept comparatively short.

With the above and other objects in view there is provided, in accordance with the invention, an integrated dynamic semiconductor memory, comprising:

a plurality of first memory cells combined to form individually addressable normal units;

a plurality of second memory cells combined to form individually addressable redundant units for replacing respective ones of the normal units;

memory units each associated with redundant units for storing in each case one address of a normal unit to be replaced;

a self-test unit,
connected to the first memory cells for performing a functional test of the first memory cells at a defined memory-retention time for the contents of the memory cell, and for carrying out an analysis as to which of the normal units are to be replaced by which of the redundant units;

connected to the memory units for programming the memory units in accordance with a result of the analysis;

configured to increase the memory-retention time following a programming of the memory units; and configured to repeat the functional test, the analysis, and the programming of the memory units until all the memory units are programmed.

In other words, the integrated dynamic semiconductor memory has memory cells which are combined to form individually addressable normal units, and memory cells which are combined to form individually addressable redundant units for replacing in each case one of the normal units. Furthermore, the semiconductor memory has memory units which are in each case associated with redundant units for storing in each case one address of a normal unit to be replaced. A functional test of the memory cells with a defined memory-retention time for the memory cell contents is carried out by means of a self-test unit. An analysis is then carried out as to which of the normal units are to be replaced by which of the redundant units. The memory units are programmed by the self-test unit in accordance with the analysis result. Following the programming of the memory units, the retention time is then increased by the self-test unit. The self-test unit repeats the steps of functional testing, analysis and programming until all the memory units, and thus all the redundant units, are programmed.

The invention is suitable for any dynamic memory in which defective units are repaired by means of redundant units. The normal units are, for example, regular word lines or bit lines, and the redundant units are redundant word lines or bit lines. However, it is also possible to replace larger units of memory cells, for example individual memory cell blocks, by means of corresponding redundant units, rather than individual word lines or bit lines.

As before, a multistage test can be carried out with the semiconductor memory according to the invention and the method according to the invention. A parallel retention test is advantageously carried out at wafer level, in which a relatively short retention time is chosen, which is required for the basic module specification. This ensures the maximum possible yield of serviceable memory modules after a retention test, and a relatively short test duration. At a later time, for example after the memory modules have been placed in their casings, a further retention test can be carried out using a self-test device according to the invention (built-in self-test BIST). This retention test is advantageously carried out separately for each memory chip. The redundant units are in this case programmed, for example, by means of electrically programmable fuses, which can be programmed by the self-test unit. The retention time is increased during the retention time until all the available memory units, and thus all the available redundant units, are programmed. The retention test is then ended. The maximum possible quality with regard to its retention time is thus achieved for each memory chip to be tested, and the testing time is limited to the period required for this purpose. The provision of the self-test unit for carrying out a retention test means that no complex test apparatus is required.

In accordance with an added feature of the invention, there is provided at least one further, non-volatile memory unit associated with one of the redundant units and containing information whether a respectively associated the redundant unit is already being used to replace one of the normal units. This redundant unit may, for example, have been used to repair a defect which was found during a retention test at wafer level. In consequence, the further, non-volatile memory unit can be configured by programmable elements such as laser fuses. A programmed, further, non-volatile memory unit indicates to the self-test device that the associated redundant unit has already been used for repair. This unit can no longer be used in a subsequent retention test by the self-test unit.

In accordance with an additional feature of the invention, the semiconductor memory has a memory device in which the retention time is stored after a retention test. This value may, for example, be stored in binary form in electrically programmable elements. If this information is accessible via external connections of the semiconductor memory, it is possible in this way to determine the quality of the memory module in terms of its retention time. This value can be used to set the time period between two self-refresh cycles to the maximum value. A long retention time is advantageous in particular for semiconductor memories which are used in mobile applications, such as laptops. Their power consumption, for example in a so-called power-down mode, is thus considerably reduced.

In accordance with another feature of the invention, the semiconductor memory has a further memory device for storing a test result. This indicates, for example, which and/or how many of the redundant units have been used for repair. This information can be read after this or at a later time and can, for example, be evaluated statistically. The memory device used, like the memory device for storing the retention time, may be provided by means of electrically programmable elements, which can be programmed by the self-test unit.

A memory cell field on a semiconductor memory is generally subdivided into a number of regions. A subregion within which a redundant unit can replace a regular unit is also referred to as a redundant domain. Within a redundant domain, faulty regular units are, for example, replaced by redundant units in the same region. In consequence, it is advantageous for a retention test to be carried out in each case separately by a self-test unit for one of the subregions.

With the above and other objects in view there is also provided, in accordance with the invention, a method for self-repair of memory cells in an integrated dynamic semiconductor memory, which comprises:

providing a semiconductor memory as outline above, namely a memory with memory cells combined to form individually addressable normal units; memory cells combined to form individually addressable redundant units for replacing in each case one of the normal units; and memory units each associated with redundant units;

functionally testing the memory cells at a defined memory-retention time for the memory cell contents, and analyzing which of the normal units are to be replaced by which of the redundant units;

programming the memory units, in accordance with a result obtained in the analyzing step, each with one address of a normal unit to be replaced;

subsequently increasing the memory-retention time; and repeating the testing, analyzing, and programming steps until all of the memory units have been programmed.

In accordance with a concomitant feature of the invention, the memory cells of the semiconductor memory in a memory cell field are subdivided into subregions, and each of the subregions is self-repaired separately in each case.

Other features which are considered as characteristic for the invention are set forth in the appended claims.

Although the invention is illustrated and described herein as embodied in an integrated dynamic semiconductor memory having redundant units of memory cells, and a method for self-repair, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
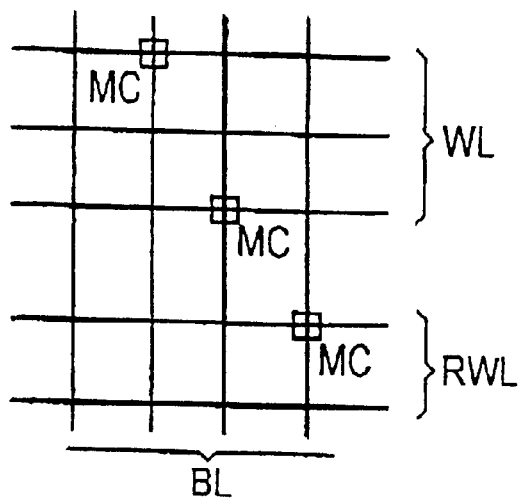
FIG. 1 is a schematic of a memory cell field, in the form of a matrix, of a semiconductor memory.

Referring now to the figures of the drawing in detail and first, particularly, to FIG. 1 thereof, there is seen a memory cell field, for example a DRAM, which is organized in the form of a matrix. The field has regular word lines WL, bit lines BL and redundant word lines RWL. Memory cells MC are arranged at the intersections of the word lines WL, RWL with the bit lines BL. The memory cells MC in the illustrated memory each contain a selection transistor and a memory capacitor. Control inputs of the selection transistors are thereby connected to one of the word lines WL or redundant word lines RWL, while a main current path for the selection transistors is arranged between the memory capacitor of the respective memory cell MC and one of the bit lines BL.

Figure 2:
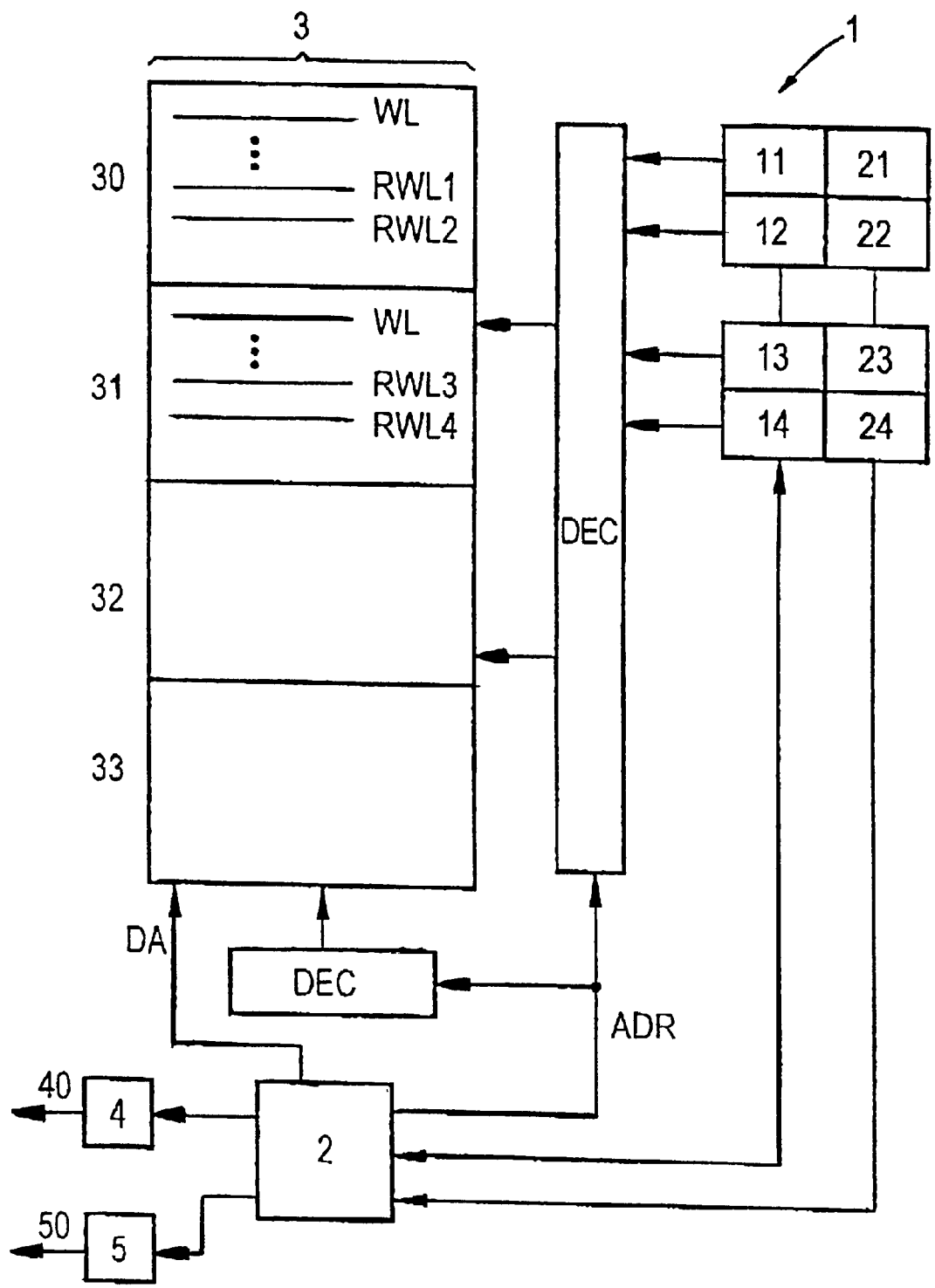
FIG. 2 is a block schematic of a circuit configuration of a memory cell field, subdivided into blocks and having a self-test unit.

Referring now to FIG. 2, there is shown one embodiment of a circuit configuration according to the invention having a memory cell field subdivided into blocks. The memory cell field 3 in the semiconductor memory 1 illustrated in FIG. 2 is in this case subdivided into four blocks 30 to 33. Each of the blocks 30 to 33 contains a number of word lines WL and, in this example, in each case two redundant word lines, in the blocks 30 and 31, RWL1, RWL2 and RWL3, RWL4, respectively. The selection circuit DEC for selection of a memory cell is connected to an address bus ADR, to which a memory cell address can be applied.

The semiconductor memory 1 also contains memory units 11 to 14, which are sequentially associated with the redundant units RWL1 to RWL4. The memory units 11 to 14 are each used to store in each case one address of a normal unit WL to be replaced.

The semiconductor memory 1 furthermore has a self-test unit 2, which is connected to the address bus ADR, to the data bus DA and to the memory units 11 to 14. During a retention test, the self-test unit 2 carries out a functional test of the memory cells MC with a defined retention time. The self-test unit 2 is furthermore connected to the non-volatile memory units 21 to 24, which are likewise each associated sequentially with one of the redundant units RWL1 to RWL4. The memory units 21 to 24 contain information as to whether one of the associated redundant units RWL1 to RWL4 is already being used to replace one of the normal units WL.

The method of operation of the circuit configuration illustrated in FIG. 2 will be explained in more detail in the following text.

First, a retention test is carried out for a redundant domain. In this example, a redundant domain of the memory cell field 3 comprises two blocks, that is to say the blocks 30 and 31, for example. The four redundant word lines RWL1 to RWL4 are available for repairing the blocks 30 and 31. It is assumed that the redundant word line RWL1 has already been used, in a previous test, for repairing a regular word line WL. At the start of a retention test, the self-test unit 2 finds out how many of the redundant units RWL1 to RWL4 are available for repair purposes. The contents of the memory units 21 to 24 are read by the self-test unit 2 for this purpose. The memory unit 21 in this case indicates that the redundant unit RWL1 has already been used for repair purposes. Only the redundant units RWL2 to RWL4 are thus still available.

In the next step, the self-test unit 2 carries out a functional test of memory cells MC with a defined retention time, followed by an analysis as to which of the regular word lines WL are to be replaced by which of the redundant word lines RWL. After this, some of the memory units 11 to 14 are programmed in accordance with the analysis result with in each case one address of a regular word line WL to be replaced. The retention time is increased by the self-test unit 2 once the memory units 11 to 14 have been programmed.

As a result of the more stringent requirements on the memory cells resulting from a longer retention time, the self-test unit 2 once again detects faulty regular word lines WL in another functional test. After repeated analysis by the self-test unit 2, further memory units of the memory units 11 to 14 are programmed with in each case one address of a regular word line WL to be replaced. After once again increasing the retention time, the steps of functional testing, analysis and programming are accordingly repeated until all the memory units 11 to 14 are programmed. Such a retention time sequence is carried out for all the redundant domains of the semiconductor memory 1. The shortest retention time determined over all the redundant domains is the finally achievable retention time of the semiconductor memory 1.

This retention time determined for the entire semiconductor memory 1 may, for example, be stored in a memory device 4. In this case, the memory device 4 has electrically programmable fuses. The present circuit configuration likewise has a memory device 5, which is used to store information as to which and/or how many of the redundant word lines RWL are used for repair purposes. The memory device 5 may, for example, have electrically programmable fuses in the same way as the memory device 4. The two memory devices 4 and 5 can be read by the signals 40 and 50, respectively, via external connections of the semiconductor memory 1.

Figure 3:
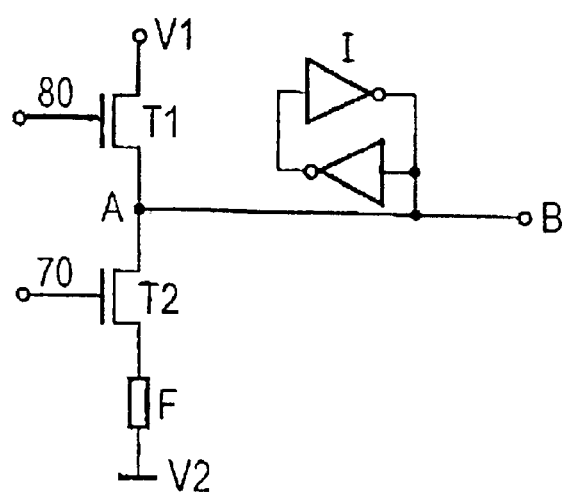
FIG. 3 is a schematic of one configuration of a non-volatile memory unit.

Referring now to FIG. 3, there is shown one embodiment of one of the non-volatile memory units 21 to 24. The unit has a non-volatile memory element in the form of a laser fuse F, as well as a fuse latch in the form of a latching circuit comprising two back-to-back connected inverters I. The node A is first of all preloaded with a value "logic 1" (which, for example, corresponds to the value of an internal supply potential V1) via the switching element T1 by means of the signal 80. The transistor T2 is then driven by the signal 70 to reset the node A, depending on the state of the fuse F, to the value "logic 0" (which, for example, corresponds to a reference-ground potential V2), or it is left in the "logic 1" state. The potential level of the node A is read at the connection B.

Figure 4:
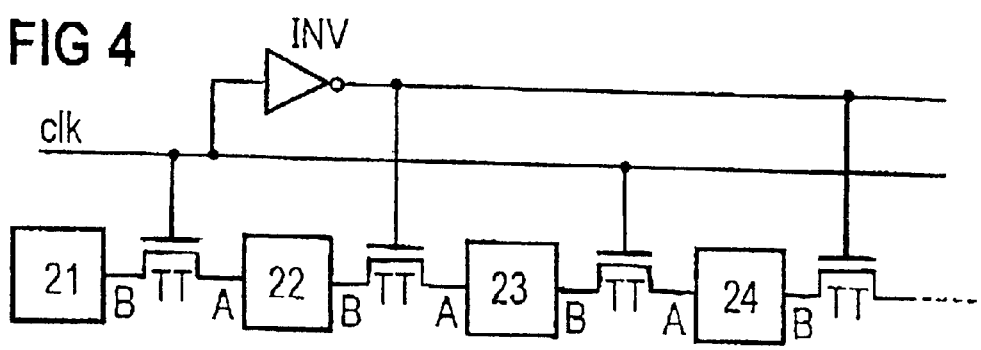
FIG. 4 is a schematic of a configuration for reading from memory units.

Referring now to FIG. 4, there is shown one embodiment of a circuit configuration for reading the memory units 21 to 24. The memory units 21 to 24 are connected to one another in the form of a shift register. They are each connected to one another, at the connections A and B, via switching elements TT. The switching elements TT are driven, for example, by an internal clock signal CLK, with every alternate one of the switching elements TT being driven by the inverted signal of the clock signal CLK.

I claim:

1. An integrated dynamic semiconductor memory, comprising:
    a plurality of first memory cells combined to form individually addressable normal units;
    a plurality of second memory cells combined to form individually addressable redundant units for replacing respective ones of said normal units;
    memory units each associated with redundant units for storing in each case one address of a normal unit to be replaced;
    a self-test unit,
        connected to said first memory cells for performing a functional test of said first memory cells at a defined memory-retention time for the contents of said memory cell, and for carrying out an analysis as to which of said normal units are to be replaced by which of said redundant units;
        connected to said memory units for programming said memory units in accordance with a result of the analysis;
        configured to increase the memory-retention time following a programming of said memory units; and
        configured to repeat the functional test, the analysis, and the programming of said memory units until all said memory units are programmed.

2. The integrated semiconductor memory according to claim 1, which comprises at least one further, non-volatile memory unit associated with one of the redundant units and containing information whether a respectively associated said redundant unit is already being used to replace one of said normal units.

3. The integrated semiconductor memory according to claim 1, which further comprises a first memory device connected to said self-test unit for storing the memory-retention time.

4. The integrated semiconductor memory according to claim 3, which further comprises a second memory device connected to said self-test unit for storing information concerning a utilization of said redundant units for repair.

5. The integrated semiconductor memory according to claim 4, wherein said first memory device and said second memory device have electrically programmable fuses.

6. The integrated semiconductor memory according to claim 3, wherein said first memory device has electrically programmable fuses.

7. The integrated semiconductor memory according to claim 1, which further comprises a memory device connected to said self-test unit for storing information concerning a utilization of said redundant units for repair.

8. The integrated semiconductor memory according to claim 7, wherein said memory device has electrically programmable fuses.

9. A method for self-repair of memory cells in an integrated dynamic semiconductor memory, which comprises:
    providing a semiconductor memory with
        memory cells combined to form individually addressable normal units;
        memory cells combined to form individually addressable redundant units for replacing in each case one of the normal units;
        memory units each associated with redundant units;
    functionally testing the memory cells at a defined memory-retention time for the memory cell contents, and analyzing which of the normal units are to be replaced by which of the redundant units;
    programming the memory units, in accordance with a result obtained in the analyzing step, each with one address of a normal unit to be replaced;
    subsequently increasing the memory-retention time; and
    repeating the testing, analyzing, and programming steps until all of the memory units are programmed.

10. The method according to claim 9, which comprises subdividing the memory cells of the semiconductor memory in a memory cell field into subregions, and self-repairing each of the subregions separately in each case.

* * * * *